(12) United States Patent
Sheydayi

(10) Patent No.: US 7,021,635 B2
(45) Date of Patent: Apr. 4, 2006

(54) VACUUM CHUCK UTILIZING SINTERED MATERIAL AND METHOD OF PROVIDING THEREOF

(75) Inventor: Alexei Sheydayi, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 368 days.

(21) Appl. No.: 10/359,923

(22) Filed: Feb. 6, 2003

(65) Prior Publication Data

US 2004/0157420 A1 Aug. 12, 2004

(51) Int. Cl.
  B25B 11/00 (2006.01)
  B23B 31/02 (2006.01)
  H01L 21/00 (2006.01)

(52) U.S. Cl. .............................. 279/3; 269/21; 438/800

(58) Field of Classification Search .................... 279/3; 438/583, 800; 134/21; 118/500, 728; 269/21
See application file for complete search history.

(56) References Cited

U.S. PATENT DOCUMENTS

| | | | |
|---|---|---|---|
| 2,617,719 A | 11/1952 | Stewart |
| 2,625,886 A | 1/1953 | Browne |
| 3,623,627 A | 11/1971 | Bolton |
| 3,689,025 A | 9/1972 | Kiser |
| 3,744,660 A | 7/1973 | Gaines et al. |
| 3,968,885 A | 7/1976 | Hassan et al. |
| 4,029,517 A | 6/1977 | Rand |
| 4,091,643 A | 5/1978 | Zucchini |
| 4,245,154 A | 1/1981 | Uehara et al. |
| 4,341,592 A | 7/1982 | Shortes et al. |
| 4,355,937 A | 10/1982 | Mack et al. |
| 4,367,140 A | 1/1983 | Wilson |
| 4,391,511 A | 7/1983 | Akiyama et al. |
| 4,406,596 A | 9/1983 | Budde |
| 4,422,651 A | 12/1983 | Platts |
| 4,426,358 A | 1/1984 | Johansson |
| 4,474,199 A | 10/1984 | Blaudszun |
| 4,522,788 A | 6/1985 | Sitek et al. |
| 4,549,467 A | 10/1985 | Wilden et al. |
| 4,574,184 A | 3/1986 | Wolf et al. |

(Continued)

FOREIGN PATENT DOCUMENTS

EP 0 244 951 A2 11/1987

(Continued)

OTHER PUBLICATIONS

Hideaki Itakura et al., "Multi-Chamber Dry Etching System", Solid State Technology, Apr. 1982, pp. 209-214.

(Continued)

*Primary Examiner*—Evan Pert
(74) *Attorney, Agent, or Firm*—Haverstock & Owens LLP

(57) ABSTRACT

A vacuum chuck for holding a semiconductor wafer during high pressure, preferably supercritical, processing comprising: a wafer holding region for holding the wafer; a vacuum region for applying vacuum to a surface of the wafer, the vacuum region within the wafer holding region; and a material, preferably sintered material, applied within the vacuum region, the material configurable to provide a uniform surface between the surface of the wafer and the wafer holding region, wherein the material is configured to allow vacuum to flow therethrough. The vacuum region preferably comprises at least one vacuum groove. Alternatively, the vacuum region includes at least two vacuum grooves that are concentrically configured on the wafer holding region. The vacuum groove alternatively comprises a tapered configuration. Alternatively, a coating material is applied between the wafer surface and the substantially smooth holding region surface, whereby the coating provides a seal between the wafer and the holding region.

21 Claims, 5 Drawing Sheets

U.S. PATENT DOCUMENTS

| | | |
|---|---|---|
| 4,592,306 A | 6/1986 | Gallego |
| 4,601,181 A | 7/1986 | Privat |
| 4,626,509 A | 12/1986 | Lyman |
| 4,670,126 A | 6/1987 | Messer et al. |
| 4,682,937 A | 7/1987 | Credle, Jr. |
| 4,693,777 A | 9/1987 | Hazano et al. |
| 4,749,440 A | 6/1988 | Blackwood et al. |
| 4,778,356 A | 10/1988 | Hicks |
| 4,788,043 A | 11/1988 | Kagiyama et al. |
| 4,789,077 A | 12/1988 | Noe |
| 4,823,976 A | 4/1989 | White, III et al. |
| 4,825,808 A | 5/1989 | Takahashi et al. |
| 4,827,867 A | 5/1989 | Takei et al. |
| 4,838,476 A | 6/1989 | Rahn |
| 4,865,061 A | 9/1989 | Fowler et al. |
| 4,879,431 A | 11/1989 | Bertoncini |
| 4,906,011 A * | 3/1990 | Hiyamizu et al. ............. 279/3 |
| 4,917,556 A | 4/1990 | Stark et al. |
| 4,924,892 A | 5/1990 | Kiba et al. |
| 4,951,601 A | 8/1990 | Maydan et al. |
| 4,960,140 A | 10/1990 | Ishijima et al. |
| 4,983,223 A | 1/1991 | Gessner |
| 5,011,542 A | 4/1991 | Weil |
| 5,044,871 A | 9/1991 | Davis et al. |
| 5,062,770 A | 11/1991 | Story et al. |
| 5,071,485 A | 12/1991 | Matthews et al. |
| 5,105,556 A | 4/1992 | Kurokawa et al. |
| 5,143,103 A | 9/1992 | Basso et al. |
| 5,167,716 A | 12/1992 | Boitnott et al. |
| 5,169,296 A | 12/1992 | Wilden |
| 5,169,408 A | 12/1992 | Biggerstaff et al. |
| 5,185,296 A | 2/1993 | Morita et al. |
| 5,186,594 A | 2/1993 | Toshima et al. |
| 5,186,718 A | 2/1993 | Tepman et al. |
| 5,188,515 A | 2/1993 | Horn |
| 5,190,373 A | 3/1993 | Dickson et al. |
| 5,191,993 A | 3/1993 | Wanger et al. |
| 5,193,560 A | 3/1993 | Tanaka et al. |
| 5,195,878 A | 3/1993 | Sahiavo et al. |
| 5,213,485 A | 5/1993 | Wilden |
| 5,217,043 A | 6/1993 | Novakovi |
| 5,221,019 A | 6/1993 | Pechacek |
| 5,222,876 A | 6/1993 | Budde |
| 5,224,504 A | 7/1993 | Thompson et al. |
| 5,236,669 A | 8/1993 | Simmons et al. |
| 5,237,824 A | 8/1993 | Pawliszyn |
| 5,240,390 A | 8/1993 | Kvinge et al. |
| 5,243,821 A | 9/1993 | Schuck et al. |
| 5,246,500 A | 9/1993 | Samata et al. |
| 5,251,776 A | 10/1993 | Morgan, Jr. et al. |
| 5,267,455 A | 12/1993 | Dewees et al. |
| 5,280,693 A | 1/1994 | Heudecker |
| 5,285,352 A | 2/1994 | Pastore et al. |
| 5,288,333 A | 2/1994 | Tanaka et al. |
| 5,313,965 A | 5/1994 | Palen |
| 5,314,574 A | 5/1994 | Takahashi |
| 5,328,722 A | 7/1994 | Ghanayem et al. |
| 5,337,446 A | 8/1994 | Smith et al. |
| 5,339,844 A | 8/1994 | Stanford, Jr. et al. |
| 5,355,901 A | 10/1994 | Mielnik et al. |
| 5,368,171 A | 11/1994 | Jackson |
| 5,370,741 A | 12/1994 | Bergman |
| 5,374,829 A | 12/1994 | Sakamoto et al. |
| 5,377,705 A | 1/1995 | Smith, Jr. et al. |
| 5,401,322 A | 3/1995 | Marshall |
| 5,404,894 A | 4/1995 | Shiraiwa |
| 5,412,958 A | 5/1995 | Iliff et al. |
| 5,417,768 A | 5/1995 | Smith, Jr. et al. |
| 5,433,334 A | 7/1995 | Reneau |
| 5,447,294 A | 9/1995 | Sakata et al. |
| 5,474,410 A | 12/1995 | Ozawa et al. |
| 5,494,526 A | 2/1996 | Paranjpe |
| 5,503,176 A | 4/1996 | Dunmire et al. |
| 5,505,219 A | 4/1996 | Lansberry et al. |
| 5,509,431 A | 4/1996 | Smith, Jr. et al. |
| 5,526,834 A | 6/1996 | Mielnik et al. |
| 5,533,538 A | 7/1996 | Marshall |
| 5,571,330 A | 11/1996 | Kyogoku |
| 5,589,224 A | 12/1996 | Tepman et al. |
| 5,621,982 A | 4/1997 | Yamashita et al. |
| 5,629,918 A | 5/1997 | Ho et al. |
| 5,644,855 A | 7/1997 | McDermott et al. |
| 5,649,809 A | 7/1997 | Stapelfeldt |
| 5,656,097 A | 8/1997 | Olesen et al. |
| 5,669,251 A | 9/1997 | Townsend et al. |
| 5,672,204 A | 9/1997 | Habuka ..................... 117/204 |
| 5,679,169 A | 10/1997 | Gonzales et al. |
| 5,702,228 A | 12/1997 | Tamai et al. |
| 5,706,319 A | 1/1998 | Holtz |
| 5,746,008 A | 5/1998 | Yamashita et al. |
| 5,769,588 A | 6/1998 | Toshima et al. |
| 5,797,719 A | 8/1998 | James et al. |
| 5,798,126 A | 8/1998 | Fujikawa et al. |
| 5,817,178 A | 10/1998 | Mita et al. .................. 118/666 |
| 5,879,459 A | 3/1999 | Gadgil et al. |
| 5,881,577 A | 3/1999 | Sauer et al. |
| 5,882,165 A | 3/1999 | Maydan et al. |
| 5,888,050 A | 3/1999 | Fitzgerald et al. |
| 5,898,727 A | 4/1999 | Fujikawa et al. |
| 5,900,107 A | 5/1999 | Murphy et al. |
| 5,904,737 A | 5/1999 | Preston et al. |
| 5,906,866 A | 5/1999 | Webb |
| 5,928,389 A | 7/1999 | Jevtic |
| 5,932,100 A | 8/1999 | Yager et al. |
| 5,934,856 A | 8/1999 | Asakawa et al. |
| 5,934,991 A | 8/1999 | Rush |
| 5,975,492 A | 11/1999 | Brenes |
| 5,979,306 A | 11/1999 | Fujikawa et al. |
| 5,980,648 A | 11/1999 | Adler |
| 5,981,399 A | 11/1999 | Kawamura et al. |
| 5,989,342 A | 11/1999 | Ikeda et al. |
| 6,005,226 A | 12/1999 | Aschner et al. |
| 6,017,820 A | 1/2000 | Ting et al. |
| 6,021,791 A | 2/2000 | Dryer et al. |
| 6,029,371 A | 2/2000 | Kamikawa et al. |
| 6,035,871 A | 3/2000 | Eui-Yeol |
| 6,037,277 A | 3/2000 | Masakara et al. |
| 6,048,494 A | 4/2000 | Annapragada |
| 6,053,348 A | 4/2000 | Morch |
| 6,056,008 A | 5/2000 | Adams et al. |
| 6,062,853 A | 5/2000 | Shimazu et al. |
| 6,067,728 A | 5/2000 | Farmer et al. |
| 6,077,053 A | 6/2000 | Fujikawa et al. |
| 6,077,321 A | 6/2000 | Adachi et al. |
| 6,082,150 A | 7/2000 | Stucker |
| 6,085,935 A | 7/2000 | Malchow et al. |
| 6,089,377 A | 7/2000 | Shimizu |
| 6,097,015 A | 8/2000 | McCullough et al. |
| 6,109,296 A | 8/2000 | Austin |
| 6,122,566 A | 9/2000 | Nguyen et al. |
| 6,128,830 A | 10/2000 | Bettcher et al. |
| 6,145,519 A | 11/2000 | Konishi et al. |
| 6,159,295 A | 12/2000 | Maskara et al. |
| 6,164,297 A | 12/2000 | Kamikawa |
| 6,186,722 B1 | 2/2001 | Shirai |
| 6,203,582 B1 | 3/2001 | Berner et al. |
| 6,216,364 B1 | 4/2001 | Tanaka et al. |
| 6,228,563 B1 | 5/2001 | Starov et al. |
| 6,235,634 B1 | 5/2001 | White et al. |
| 6,239,038 B1 | 5/2001 | Wen |
| 6,241,825 B1 | 6/2001 | Wytman ..................... 118/733 |
| 6,244,121 B1 | 6/2001 | Hunter |
| 6,251,250 B1 | 6/2001 | Keigler |
| 6,277,753 B1 | 8/2001 | Mullee et al. |

| | | |
|---|---|---|
| 6,286,231 B1 | 9/2001 | Bergman et al. |
| 6,305,677 B1 | 10/2001 | Lenz .................... 269/13 |
| 6,333,268 B1 | 12/2001 | Starov et al. |
| 6,334,266 B1 | 1/2002 | Moritz et al. |
| 6,344,174 B1 | 2/2002 | Miller et al. |
| 6,355,072 B1 | 3/2002 | Racette et al. |
| 6,388,317 B1 | 5/2002 | Reese |
| 6,389,677 B1 | 5/2002 | Lenz .................... 29/559 |
| 6,406,782 B1 | 6/2002 | Johnson et al. |
| 6,418,956 B1 | 7/2002 | Bloom |
| 6,436,824 B1 | 8/2002 | Chooi et al. |
| 6,454,519 B1 | 9/2002 | Toshima et al. |
| 6,454,945 B1 | 9/2002 | Weigl et al. |
| 6,464,790 B1 | 10/2002 | Sheristinsky et al. ....... 118/715 |
| 6,465,403 B1 | 10/2002 | Skee |
| 6,508,259 B1 | 1/2003 | Tseronis et al. ............ 134/105 |
| 6,509,141 B1 | 1/2003 | Mullee |
| 6,521,466 B1 | 2/2003 | Castrucci |
| 6,541,278 B1 | 4/2003 | Morita et al. |
| 6,546,946 B1 | 4/2003 | Dunmire |
| 6,550,484 B1 | 4/2003 | Gopinath et al. |
| 6,558,475 B1 | 5/2003 | Simons et al. |
| 6,561,213 B1 | 5/2003 | Wang et al. |
| 6,561,220 B1 | 5/2003 | McCullough et al. |
| 6,561,481 B1 | 5/2003 | Filonczuk |
| 6,561,767 B1 | 5/2003 | Biberger et al. |
| 6,564,826 B1 | 5/2003 | Shen |
| 6,634,882 B1 * | 10/2003 | Goodman .................... 432/253 |
| 6,635,565 B1 | 10/2003 | Wu et al. |
| 6,641,678 B1 | 11/2003 | DeYoung et al. |
| 6,722,642 B1 | 4/2004 | Sutton et al. |
| 2001/0050096 A1 | 12/2001 | Costantini et al. |
| 2002/0001929 A1 | 1/2002 | Biberger et al. |
| 2003/0036023 A1 | 2/2003 | Moreau et al. |
| 2003/0205510 A1 | 11/2003 | Jackson |
| 2004/0020518 A1 | 2/2004 | DeYoung et al. |
| 2004/0134515 A1 | 7/2004 | Castrucci |

FOREIGN PATENT DOCUMENTS

| | | |
|---|---|---|
| EP | 0 272 141 A2 | 6/1988 |
| EP | 0 453 867 A1 | 10/1991 |
| EP | 0 572 913 A1 | 12/1993 |
| EP | 0 587 168 A1 | 3/1994 |
| EP | 0 679 753 B1 | 11/1995 |
| EP | 0 903 775 A2 | 3/1999 |
| GB | 2 003 975 | 3/1979 |
| GB | 2 193 482 | 2/1988 |
| JP | 56-142629 | 11/1981 |
| JP | 60-238479 | 11/1985 |
| JP | 60-246635 | 12/1985 |
| JP | 61-017151 | 1/1986 |
| JP | 61-231166 | 10/1986 |
| JP | 62-125619 | 6/1987 |
| JP | 63-303059 | 12/1988 |
| JP | 2-148841 | 6/1990 |
| JP | 2-209729 | 8/1990 |
| JP | 8-186140 | 7/1996 |
| JP | 8-206485 | 8/1996 |
| JP | 10-144757 | 5/1998 |
| JP | 10-335408 | 12/1998 |
| JP | 11-200035 | 7/1999 |
| JP | 2000/106358 | 4/2000 |
| WO | WO 87/07309 | 12/1987 |
| WO | WO 91/12629 | 8/1991 |
| WO | WO 99/18603 | 4/1999 |
| WO | WO 00/36635 | 6/2000 |
| WO | WO 01/10733 A1 | 2/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A3 | 12/2001 |
| WO | WO 02/16051 A2 | 2/2002 |
| WO | WO 03/030219 A2 | 10/2003 |

OTHER PUBLICATIONS

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gallagher-Wetmore, P. et al., "Supercritical Fluid Processing: A New Dry Technique for Photoresist Developing," SPIE vol. 2438, pp. 694-708, Jun. 1995.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning using Supercritical Fluids," J. Vac, Sci, Technol. A. vol. 11, No. 4, Jul. 1993, pp. 1696-1701.

Hansen, B.N. et al., "Supercritical Fluid Transport—Chemical Deposition of Films,"Chem. Mater., vol. 4, No. 4, pp., 749-752, 1992.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

Joseph L. Foszcz, "Diaphragm Pumps Eliminate Seal Problems", Plant Engineering , pp. 1-5, Feb. 1, 1996.

Bob Agnew, "WILDEN Air-Operated Diaphragm Pumps", Process & Industrial Training Technologies, Inc., 1996.

* cited by examiner

VACUUM CHUCK UTILIZING SINTERED MATERIAL AND METHOD OF PROVIDING THEREOF

FIELD OF THE INVENTION

This invention relates to the field of high pressure processing. More particularly, this invention relates to a method and apparatus utilizing a sintered material to support a semiconductor wafer during high pressure processing.

BACKGROUND OF THE INVENTION

Processing of semiconductor substrates or wafers presents unique problems not associated with processing of other workpieces. Typically, the semiconductor processing begins with a silicon wafer. The semiconductor processing starts with doping of the silicon wafer to produce transistors. Next, the semiconductor processing continues with deposition of metal and dielectric layers interspersed with etching of lines and vias to produce transistor contacts and interconnect structures. Ultimately in semiconductor processing, the transistors, the transistor contacts, and the interconnects form integrated circuits.

A critical processing requirement for the processing of the semiconductor wafer is cleanliness. Much of semiconductor processing takes place in vacuum, which is an inherently clean environment. Other semiconductor processing takes place in a wet process at atmospheric pressure, which because of a rinsing nature of the wet process is an inherently clean process. For example, removal of photoresist and photoresist residue subsequent to etching of the lines and the vias uses plasma ashing, a vacuum process, followed by stripping in a stripper bath, a wet process.

Other critical processing requirements for the processing of the semiconductor wafers include throughput and reliability. Production processing of the semiconductor wafers takes place in a semiconductor fabrication facility. The semiconductor fabrication facility requires a large capital outlay for processing equipment, for the facility itself, and for a staff to run it. In order to recoup these expenses and generate a sufficient income from the facility, the processing equipment requires a throughput of a sufficient number of the wafers in a period of time. The processing equipment must also promote a reliable process in order to ensure continued revenue from the facility.

Until recently, the plasma ashing and the stripper bath were found sufficient for the removal of the photoresist and the photoresist residue in the semiconductor processing. However, recent advancements for the integrated circuits have made the plasma ashing and the stripper bath untenable for highly advanced integrated circuits. These recent advancements include small critical dimensions for etch features and low dielectric constant materials for insulators. The small critical dimensions for the etch features result in insufficient structure for lines to withstand the stripper bath leading to a need for a replacement for the stripper bath. Many of the low dielectric constant materials cannot withstand an oxygen environment of the plasma ashing leading to a need for a replacement for the plasma ashing.

Recently, interest has developed in replacing the plasma ashing and the stripper bath for the removal of the photoresist and the photoresist residue with a supercritical process. The methods for holding semiconductor wafers in position during processing are well known in the art. The physical environment in which the wafer is subjected is the largest determining factor as to which method to use to restrain the wafer during processing. The use of high pressure and high temperature carbon dioxide is fairly new to the semiconductor processing arena. High pressure processing chambers of existing supercritical processing systems are not appropriate to meet the unique needs of the semiconductor processing. In particular, high pressure chambers of existing supercritical processing systems do not provide a device for securing the semiconductor wafer during the supercritical processing that does not break the semiconductor wafers or otherwise damage the semiconductor wafer.

Vacuum has been used in many different semiconductor equipment types to hold the wafer to a metal "chuck" for processing. In certain types of vacuum chucks, a vacuum groove is used to hold the semiconductor wafer to the semiconductor holding region. In these types of vacuum chucks, the underside of a semiconductor wafer has a sufficient roughness which allows leakage to occur between the underside of the wafer and the extremely smooth chuck surface. The leakage between the wafer and the chuck surface poses a problem, because the wafer is not sufficiently held on the chuck surface as the supercritical process begins.

In addition, it has been found that a vacuum groove upon which the semiconductor wafer spans creates excessively high stresses in the wafer when subjected to the high pressure environment. Based upon the strength of a wafer, either the width of the vacuum groove must be reduced to eliminate the possibility of damage to the wafer or the external force pushing the wafer into the vacuum groove (gas pressure) must be reduced. In order to perform the necessary processing on the wafer, the pressure cannot be reduced. Unfortunately, the width of the vacuum groove and the depth required for sufficient vacuum holding, border on the limits of current machine shop technology. Even with the thinnest vacuum groove producible, significant stresses are still developed in the wafer when subjected to a high pressure environment as well as the vacuum applied to the semiconductor wafer.

What is needed is a method and apparatus for minimizing leakage between the underside of the semiconductor wafer and the surface of the vacuum chuck, such that the wafer is sufficiently held onto the chuck surface. What is also needed is a method and apparatus for holding the semiconductor wafer during the supercritical processing which does not break the semiconductor wafer or otherwise damage the semiconductor wafer when placed on the vacuum chuck.

SUMMARY OF THE INVENTION

One aspect of the invention is directed to a vacuum chuck for holding a semiconductor wafer during high pressure processing. The vacuum chuck comprises a semiconductor holding region for holding the semiconductor wafer. The vacuum chuck includes a vacuum port for applying vacuum to a surface of the semiconductor wafer. The vacuum chuck includes a material that is applied between the surface of the semiconductor wafer and the semiconductor holding region. The material, preferably a sintered material, is configurable to provide a uniform surface between the surface of the semiconductor wafer and the semiconductor holding region. The vacuum chuck further includes a vacuum region, such as vacuum groove, coupled to the vacuum port. The vacuum groove alternatively has a tapered configuration. The vacuum region is positioned to apply the vacuum to the surface of the semiconductor wafer. The semiconductor holding region has a smooth surface.

In yet another aspect, the invention is directed to a vacuum chuck for holding a semiconductor wafer during high pressure processing. The vacuum chuck comprises a semiconductor wafer holding region and a vacuum region that is located within the holding region. The vacuum region applies vacuum to a surface of the semiconductor wafer. A sintered material is applied between the surface and the vacuum region, wherein the sintered material relieves stress that is applied by the vacuum. The vacuum region comprises one or more vacuum grooves, whereby the one or more vacuum grooves alternatively have a tapered configuration. The vacuum chuck further comprises a port which provides the vacuum and is coupled to the vacuum region.

In yet another aspect of the invention is directed to a method of holding of a semiconductor wafer to a vacuum chuck during a high pressure process. The method comprises providing the vacuum chuck which has a semiconductor holding region. The method includes applying a sintered material between a surface of the semiconductor wafer and the semiconductor holding region. The method also includes placing the semiconductor wafer to the semiconductor holding region such that the surface of the semiconductor wafer is mated with the semiconductor holding region. The method also includes applying a vacuum to the mating surface, whereby the material secures the semiconductor wafer to the semiconductor holding region by utilizing the vacuum.

In yet another aspect of the invention, a vacuum chuck for holding a semiconductor wafer during high pressure processing. The vacuum chuck comprises a semiconductor holding region for holding the semiconductor wafer and a vacuum region for applying vacuum to a surface of the semiconductor wafer. The vacuum chuck also includes a first material that is applied between the surface of the semiconductor wafer and the semiconductor holding region. The first material provides an airtight seal between the surface of the semiconductor wafer and the semiconductor holding region. A second material is applied between the surface and the vacuum region. The second material provides a substantially uniform surface between the surface and the semiconductor holding region.

DETAILED DESCRIPTION OF THE PREFERRED EMBODIMENT

Figure 1A:
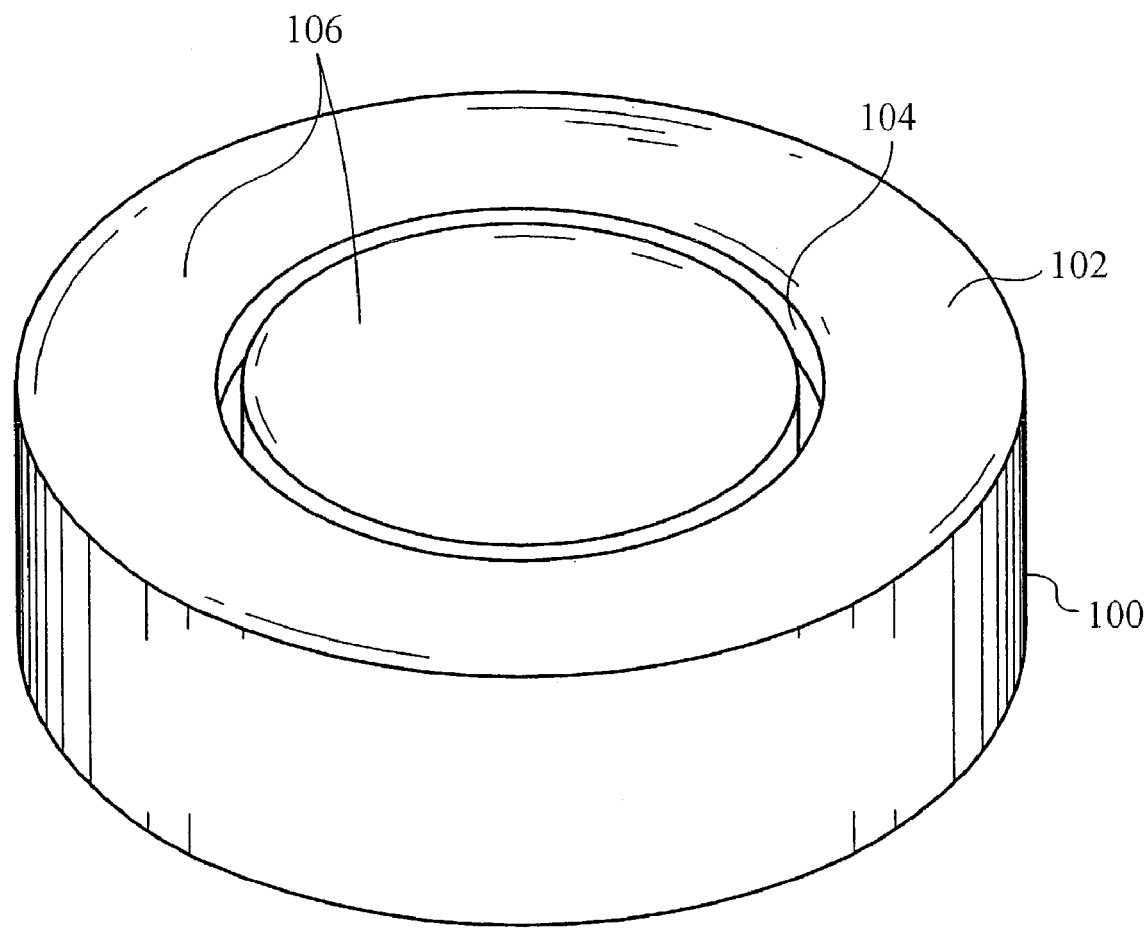
FIG. 1A illustrates a perspective view of a vacuum chuck used with the methods in accordance with the present invention.

The preferred vacuum chuck of the present invention preferably holds a semiconductor wafer in a pressure chamber during high pressure, preferably supercritical, processing. FIG. 1A illustrates a perspective view of a vacuum chuck 100 used with the methods in accordance with the present invention. The vacuum chuck 100 is shown having a circular configuration. Alternatively, the vacuum chuck 100 has other shaped configurations, including, but not limited to square or rectangular shapes. The vacuum chuck 100 is preferably a single piece, as shown in FIG. 1A. Alternatively, the vacuum chuck 100 is an assembly of several parts or part of a chamber wall (not shown). The vacuum chuck 100 includes a wafer platen 102 shown at the top surface of the chuck 100. The wafer platen 102 includes a vacuum region 104 and a semiconductor holding region 106. The holding region 106 includes the area of the wafer platen 102 on top of which the semiconductor wafer (not shown) is placed. The holding region 106 is preferably a smooth and has an ultra-flat surface.

The vacuum region 104 in FIG. 1A is shown preferably as a circular or vacuum groove 104 which is described herein for exemplary purposes. Alternatively, the vacuum region 104 includes a vacuum hole (not shown). Preferably, the vacuum groove 104 has a diameter which is smaller than the outer diameter of the semiconductor wafer 99 which is being processed under the supercritical conditions. However, it is contemplated that the diameter of the vacuum groove 104 is alternatively larger than the outer diameter of the semiconductor wafer 99. In addition, the vacuum groove 104 preferably has a minimum depth of 0.100 inch and a width range of 0.100–0.300 inches. Other dimensions of the vacuum groove 104 are contemplated, however. Alternatively, more than one vacuum groove is configured on the wafer platen 102, whereby the multiple vacuum grooves are concentrically formed about the center of the wafer platen 102. It should be noted, preferably, that the diameter of the vacuum groove 104 is at least 0.100 inches smaller than the outer diameter of the wafer 99. Alternatively, the diameter of the vacuum groove 104 is substantially equivalent to the outer diameter of the semiconductor wafer, such that the semiconductor wafer is sufficiently held on the wafer platen 102 and the force caused by the vacuum applied at the vacuum region 104 is not compromised.

Figure 1B:
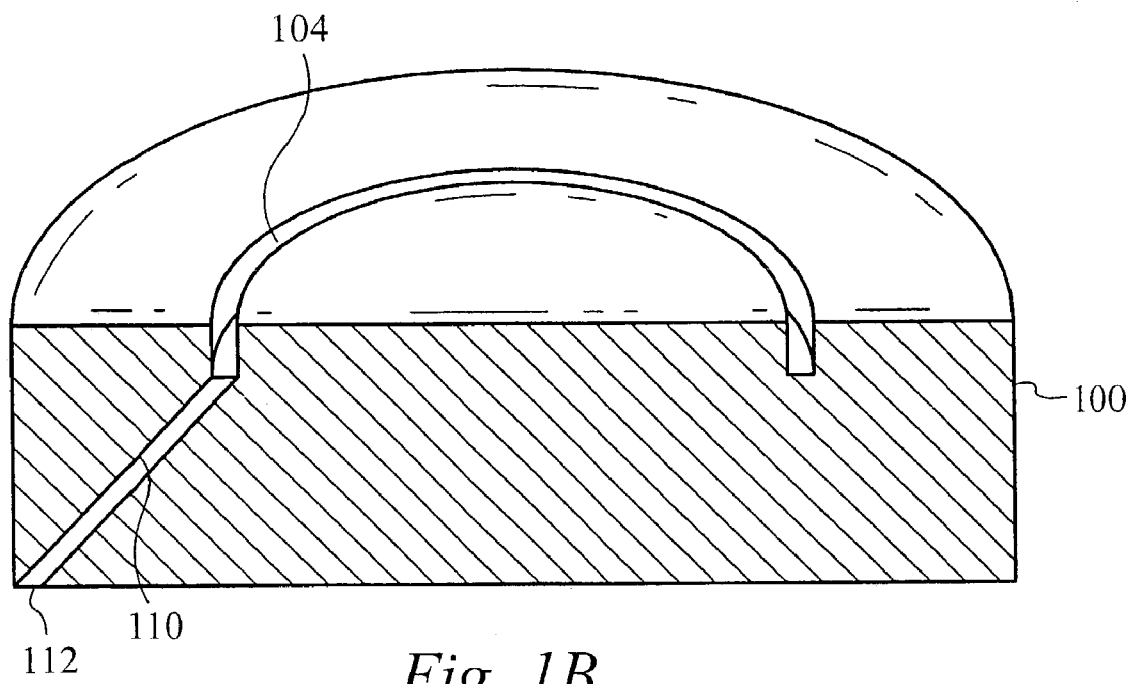
FIG. 1B illustrates a cross sectional view of the vacuum chuck used in accordance with the method of the present invention.

FIG. 1B illustrates a cross sectional view of the vacuum chuck 100 in accordance with the present invention. A vacuum plenum 110 is shown in FIG. 1B connected to the vacuum groove 104. A vacuum producing device (not shown) is coupled to the vacuum port end 112 of the vacuum plenum 110, whereby vacuum produced by the vacuum producing device (not shown) causes a suction force that is applied to the bottom surface 98 of the wafer 99. Alternatively, multiple vacuum ports and lines are used and are coupled to the vacuum groove 104. Alternatively, small spider-web type features are created on the surface of the wafer platen for better distribution of the vacuum flow (not shown). For purposes of describing the present invention, the port 112 of the vacuum plenum 110 and vacuum groove 104 are considered to be at atmospheric or vacuum pressure and the wafer platen 102 of the vacuum chuck 100 are subjected to high pressure.

Figure 2:
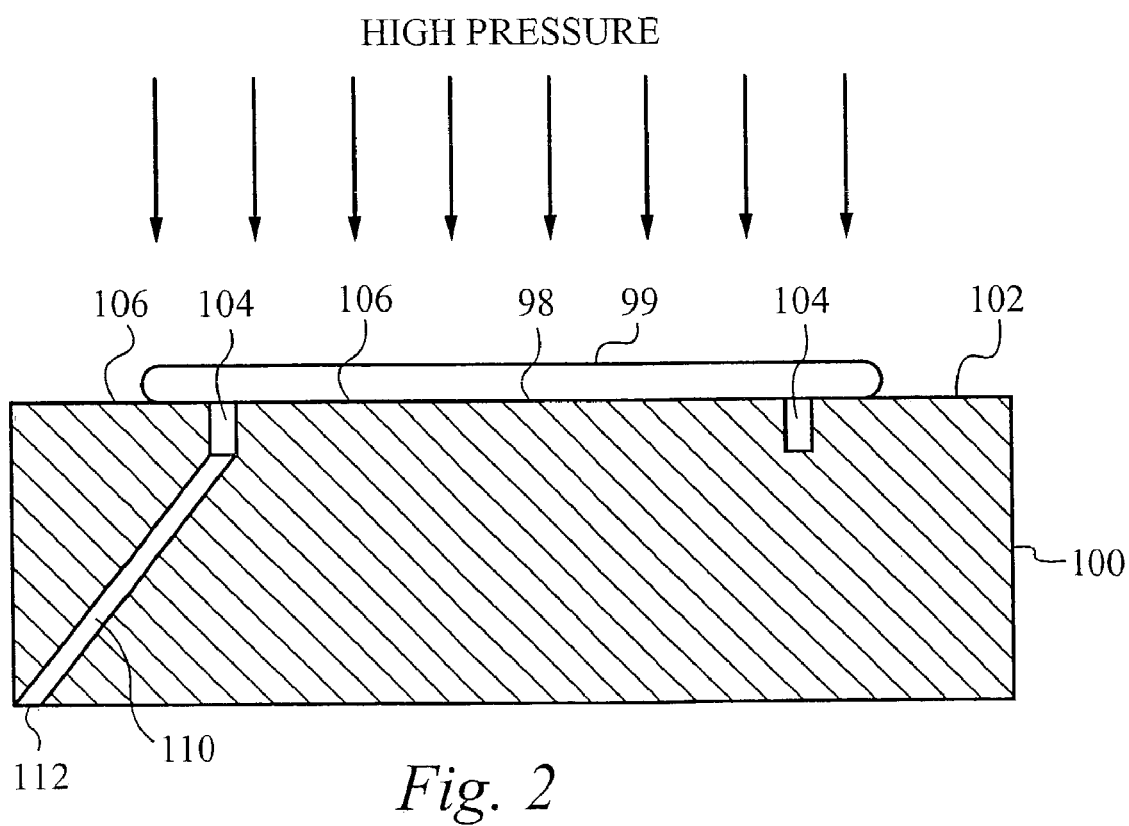
FIG. 2 illustrates a cross sectional view of the vacuum chuck with a semiconductor wafer being held thereupon.

FIG. 2 illustrates a cross sectional view of the vacuum chuck 100 with a semiconductor wafer 99 being held thereupon in accordance with the present invention. The semiconductor wafer 99 preferably has a diameter of 200 mm, although wafers having other diameters are contemplated. The semiconductor wafer 99 is placed upon the wafer platen 102, whereby a bottom surface 98 of the semiconductor wafer 98 is in contact with holding region 106 of the wafer platen 102. The vacuum groove 104 is shown in FIG. 2 as having a smaller diameter than the outer diameter of the semiconductor wafer 99. This allows vacuum applied through the vacuum plenum 110 to apply a uniform suction force to the bottom surface 98 of the semiconductor wafer 99 and thereby hold the semiconductor wafer 99 to the platen 102.

The bottom surface 98 of the semiconductor wafer 99 has a sufficient surface roughness that leakage occurs between the underside 98 of the wafer 99 and the vacuum region 104. This leakage prevents the semiconductor wafer 99 from being sufficiently held to the surface vacuum chuck 100 under the large pressure forces of the supercritical process. In addition, as stated above, the magnitude of the suction force applied to the bottom surface 98 and the supercritical process pressure applied to the top surface 97 of the wafer 99 causes large stresses to the wafer 99 which, in turn, may cause the wafer 99 to break at the vacuum region 104.

As stated above, during the supercritical process, high pressure forces and suction forces from the vacuum region 104 are applied to the semiconductor wafer 99 and the vacuum chuck 100. The suction forces from the vacuum port 112 and through the vacuum region 104 secure the wafer to the wafer platen 102. The wafer 99 is generally made of silicon, which is a brittle material. As stated above, the configuration of the vacuum region 104 and the semiconductor wafer 99 cause significant amounts of stress on the wafer 99. In particular, the suction forces from the vacuum region 104 below the wafer 99 along with the high pressure forces above the top surface of the wafer 99 cause large stresses in the wafer 99 such that the wafer 99 may crack or break at the locations near or above the vacuum groove 104. In order to reduce the amount of stress applied to the wafer 99 at these locations, the wafer platen 102 of the vacuum chuck 100 of the present invention is configured under the present invention to fully support the bottom surface 98 of the wafer 99, as discussed below.

Figure 3:
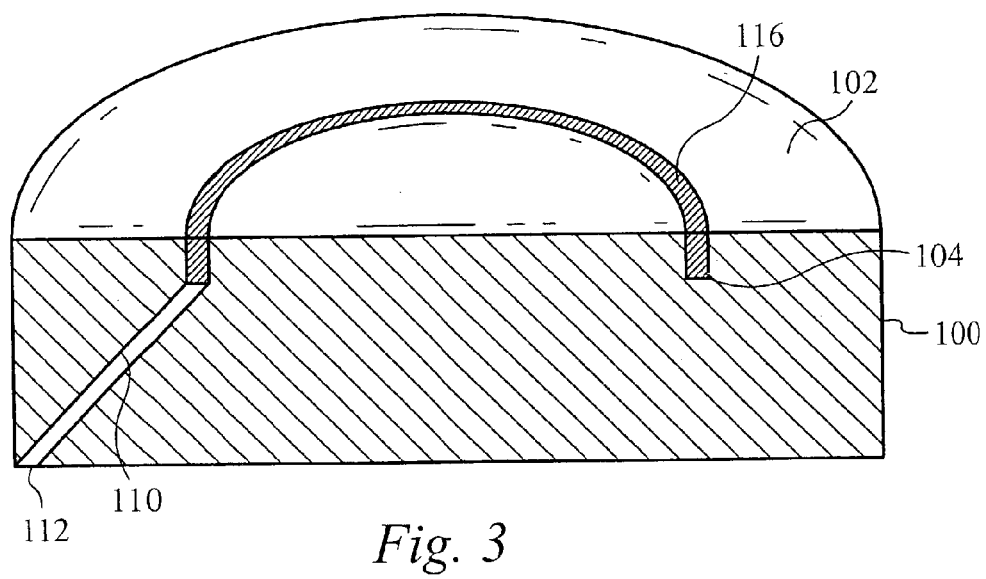
FIG. 3 illustrates a cross sectional view of the vacuum chuck having a sintered material within the vacuum groove in accordance with the present invention.

FIG. 3 illustrates a cross sectional view of the vacuum chuck having a sintered material 116 within the vacuum groove 104 in accordance with the present invention. Alternatively, the sintered material 116 is applied to multiple vacuum grooves 104 if more than one vacuum groove 104 is configured in the vacuum chuck 100. As stated above, the semiconductor wafer 99 is held to the vacuum chuck 100 by a vacuum or suction force applied from the vacuum region as well as the high pressure applied from the above the wafer 99. The sintered material 116 is applied within the vacuum groove 104, whereby the sintered material 116 fills the channel of the vacuum groove 104. By filling the channel of the vacuum groove 104, the sintered material 116 creates a surface that is uniform with the surface of the holding region 106 and thereby forms an overall flat surface underneath the wafer 99. In addition, the sintered material 116 maintains the overall vacuum forces that are applied through the vacuum groove due to the sintered material's 116 porosity, as will be discussed below. Therefore, the semiconductor wafer 99 does not experience large stress forces, because the sintered material 116 completely supports the underside of the wafer 99 against the high pressure forces present as well as allows vacuum from the vacuum port 112 to be applied through the vacuum groove 104 to the wafer 99. Additionally, the presence of the sintered material 116 in the vacuum region advantageously prevents any fragments of the wafer 99 from being sucked down the vacuum port 112 if the wafer 99 were to break. This allows clean up of the broken wafer 99 to be much easier than in the present methods.

It is known in the art that sintered material 116 is created by compressing powder, preferably metal powder, under high pressure and heating it to melt together. Sintered material 116 is alternatively produced using a number of different materials other than metal. Further, it is known in the art that different sintered materials can be created with various density and porosity properties. For instance, gas and liquid filters are available which utilize a sintered material as a filter element. The flow rate of the vacuum as well as the material strength of the sintered material 116 are preferably controlled by the density of the sintered material 116. In other words, the sintered material 116 is softer or more flexible as it becomes less dense.

In the present invention, sintered stainless steel material is preferably used due to its strength and advantageous corrosion properties. Sintered stainless steel material commonly has a density in the range of 70 percent to 82 percent. Thus, 18 to 30 percent of the stainless steel sintered material 116 is open or porous such that gas or fluid can pass through the sintered material 116. Therefore, the sintered material 116 allows vacuum to pass therethrough and ultimately provide suction to the bottom surface of the wafer 99. It is preferred that the wafer 99 itself does not bend or deflect on the wafer platen 102 due to the high pressure forces and the vacuum forces. Therefore, to support the bottom surface 98 of the wafer 100 and keep the wafer 100 from bending or deflecting, the sintered material 116 is preferably placed within the vacuum groove 104 and is in the upper range of density. In effect, the minimum deflection of the semiconductor wafer 99 at the vacuum groove 104 prevents the wafer 99 from experiencing any stress near or on the vacuum region 104.

As shown in FIG. 3, the sintered material 116 is placed within the vacuum groove 104 of the vacuum chuck 100. The sintered material 116 is preferably applied to the vacuum chuck 100 by welding the sintered material 116 to the inner walls of the vacuum groove 104. The sintered material 116 is preferably welded within the vacuum groove 104 using a laser. Alternatively, the sintered material 116 is welded to the vacuum groove 106 using an electron beam. Alternatively, the sintered material 116 is applied to the vacuum groove 104 by other methods including, but not limited to, brazing, bolting from the side of the vacuum groove 104, applying a force fit and using the weight of the sintered material 116 itself.

In an alternative process, the sintered material 116 is applied to the bottom surface 98 of the semiconductor wafer 99 instead of directly within the vacuum groove 104. In this alternative case, a ring of sintered material 116 having a diameter corresponding to the diameter the vacuum groove 104 is applied to the bottom surface 98 the wafer 99. In this alternative embodiment, an alignment means (not shown) is also used to ensure that the ring of sintered material 116 on the bottom surface 98 of the wafer 99 is automatically aligned with and directly placed within the vacuum groove 104 when the wafer 99 is positioned onto the holding region 106.

Figure 4A:
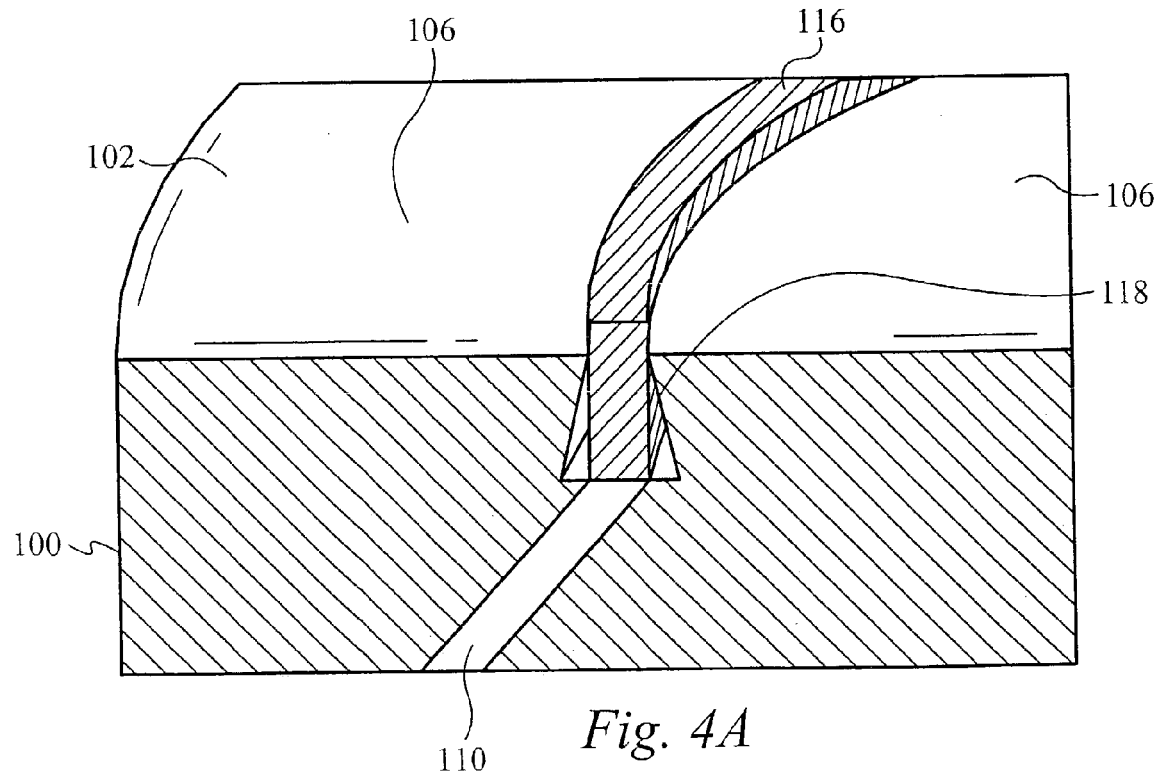
FIG. 4A illustrates an alternative embodiment of the vacuum groove having a tapered configuration.
Figure 4B:
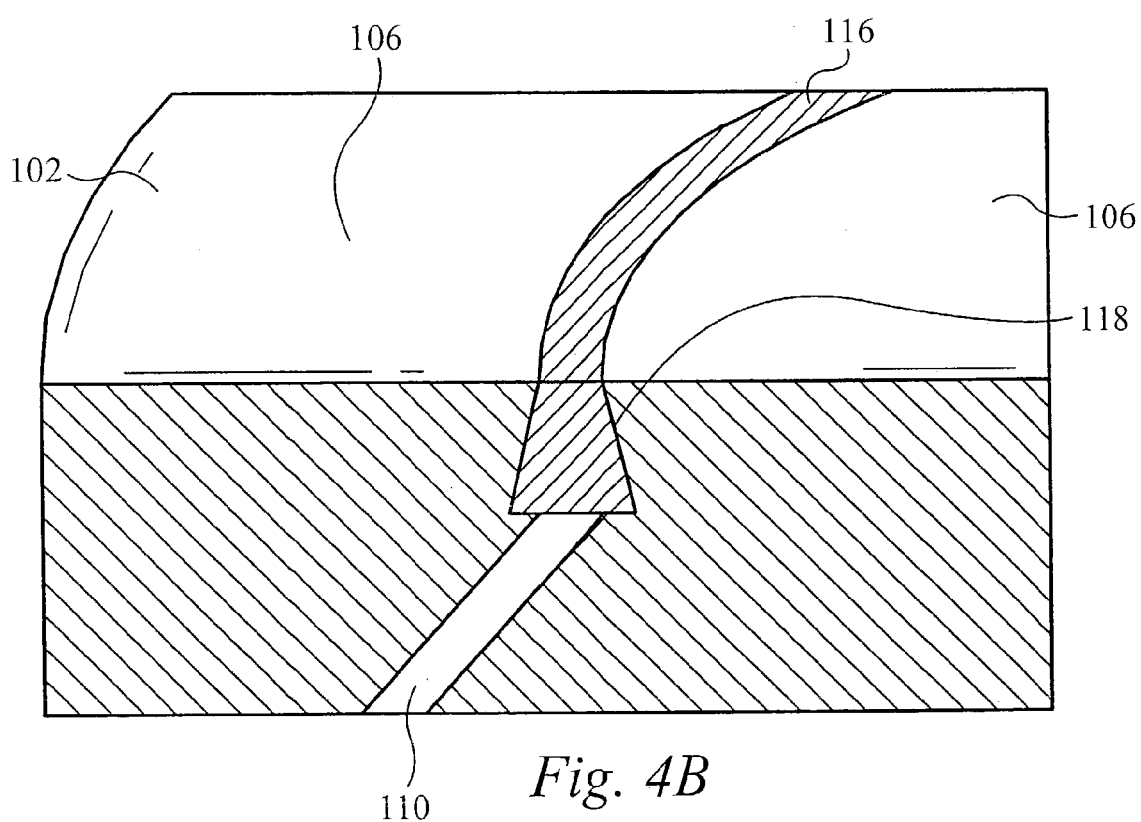
FIG. 4B illustrates an alternative embodiment of the vacuum groove having a tapered configuration.

FIG. 4A illustrates an alternative embodiment of the vacuum groove 118, whereby the vacuum groove 118 has a tapered configuration or a tapered channel. As shown in FIG. 4A, the tapered channel has a smaller width near the surface of the holding region 106 which gradually increases towards a larger width at the bottom of the vacuum groove 118. The larger width of the tapered channel receives the sintered material 116 within the vacuum groove and the smaller width of the tapered channel secures the sintered material 116 within the vacuum groove. The sintered material 116 is preferably applied to the tapered vacuum groove by using a large downward force to squeeze the sintered material 116 into the vacuum groove 118. Alternatively, the sintered material 116 is applied to the tapered vacuum groove using any of the methods described above. As shown in FIG. 4B, the sintered material 116 is pressed downward into the vacuum groove 118, whereby the sintered material 116 fills in the larger width portion of the vacuum groove 118 and the smaller width portion retains the sintered material 116 within the vacuum groove 118.

Figure 5:
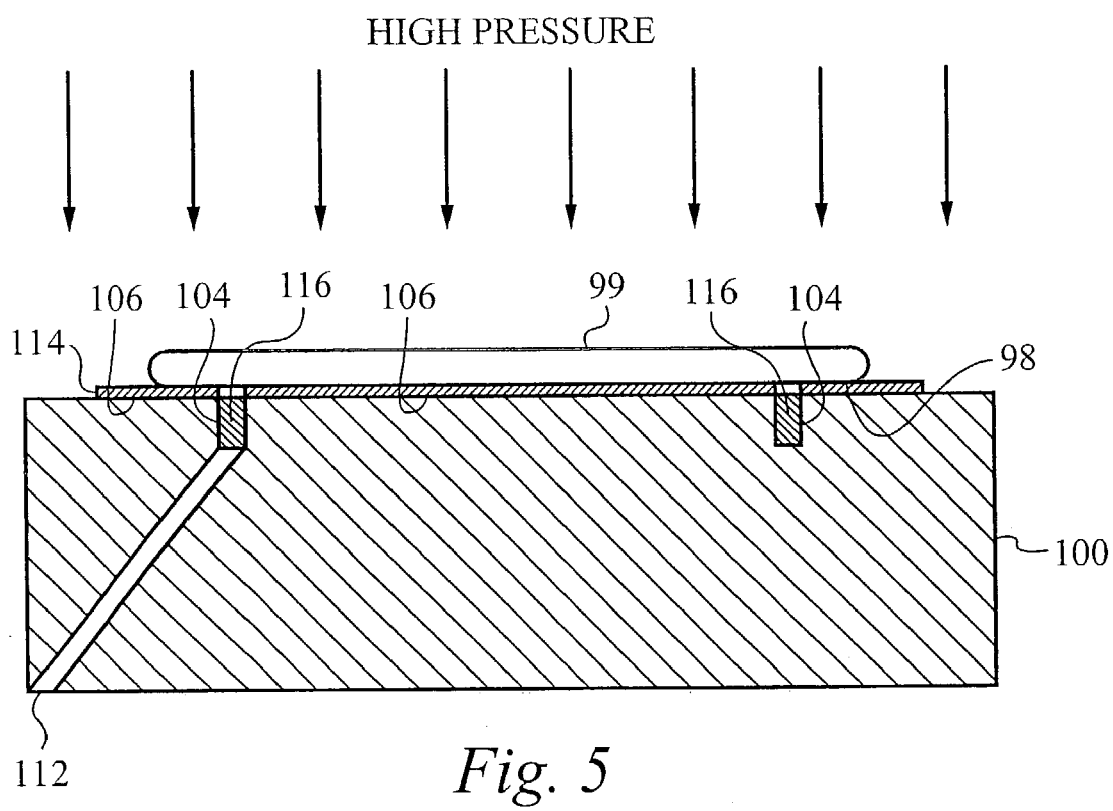
FIG. 5 illustrates a cross section of the vacuum chuck having the coating material and the sintered material applied thereto in accordance with the present invention.

It is also contemplated that the vacuum chuck 100 of the present invention utilizes both a coating material 114 and the sintered material 116 during supercritical processing of the wafer 99. FIG. 5 illustrates a cross section of the vacuum chuck 100 having the coating material 114 as well as the sintered material 116 between the wafer 99 and the wafer platen 102. As shown in FIG. 5, a thin layer of the coating material 114 is applied to the holding region 106. In addition, the sintered material 116 is applied to the vacuum region 104.

The thin layer of coating 114 between the wafer 99 and the holding region 106 provides enough compliance with the bottom surface 98 of the wafer 99 to "mold" to the microscopic irregularities that are present in the bottom surface 98 of the wafer 99. In effect, the coating material 114 prevents vacuum from escaping through the microscopic irregularities of the bottom surface 98 of the wafer and also prevents high pressure from above the wafer 99 to leak between the bottom surface 98 of the wafer and the vacuum groove 104. Thus, the coating 114 provides a substantially uniform seal between the bottom surface 98 of the wafer 99 and the holding region 106 of the chuck 100, such that the vacuum between the wafer 99 and the vacuum chuck 100 is not compromised. The coating material 114 is preferably made of a suitable polymer, such as Polyetheretherketone (PEEK). However, the coating material 114 alternatively is a monomer, paint, cellulose, any organic or inorganic substance or a combination thereof. Alternatively, the coating material 114 is made of any other appropriate material which has characteristics suitable for providing a seal between the bottom surface 98 semiconductor wafer surface and the wafer holding region 106 of the chuck 100. The details of the coating material are described in co-pending U.S. patent application Ser. No. 10/359,965 filed on Feb. 7, 2003 and entitled, "METHOD AND APPARATUS OF UTILIZING A COATING FOR ENHANCED HOLDING OF A SEMICONDUCTOR SUBSTRATE DURING HIGH PRESSURE PROCESSING" which is hereby incorporated by reference.

Figure 6:
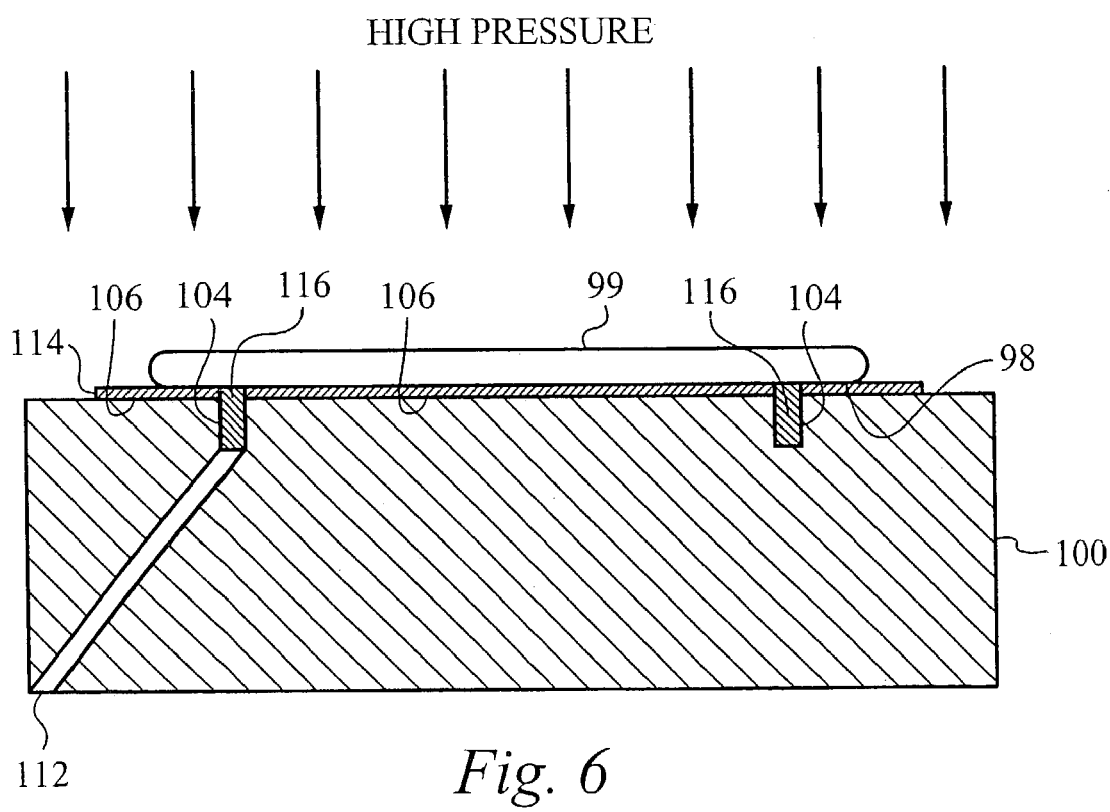
FIG. 6 illustrates a cross section of the vacuum chuck having the coating material and the sintered material applied thereto in accordance with the present invention.

In addition, the sintered material 116 is applied into the vacuum groove 104 until the channel within the vacuum groove 104 is filled with the sintered material 116 and forms a surface uniform with the top or mating surface of the holding region 106, as shown in FIG. 5. Alternatively, an appropriate additional amount of sintered material 116 is applied to the vacuum region 104 to provide a surface uniform with the surface of the coating material 114, as shown in FIG. 6. It should be noted that the thin layer of coating material 114 is not applied to the vacuum region 104 due to the presence of the sintered material 116. Alternatively, the coating 114 and sintered material 116, individually or in combination, are applied to the bottom surface 98 of the wafer 99, as discussed above.

Once the coating 114 and sintered material 116 are applied to the vacuum chuck, the semiconductor 99 is mated with the coating material 114 along the mating surface. As discussed above, the coating material 114 molds to the irregularities present in the bottom surface 98 of the wafer 99 and thereby creates a seal which holds the wafer 99 to the vacuum chuck 100. In addition, the sintered material 116 provides a flat surface with the holding region 106, or alternatively the coating material 114, whereby vacuum from the vacuum port 112 through the vacuum groove 104 does not cause excessive stresses to the wafer 99.

It will be readily apparent to one skilled in the art that other various modifications may be made to the preferred embodiment without departing from the spirit and scope of the invention as defined by the appended claims.

What is claimed is:

1. A vacuum chuck for holding a semiconductor wafer during high pressure processing comprising:
   a. a wafer holding region for holding the semiconductor wafer;
   b. a vacuum region recess for applying vacuum to a surface of the semiconductor wafer, the vacuum region recess within the wafer holding region; and
   c. a material applied within the vacuum region recess, the material configurable to provide a uniform surface between the surface of the semiconductor wafer and the wafer holding region, wherein the material is configured to allow vacuum to flow therethrough.

2. The vacuum chuck of claim 1 wherein the wafer holding region comprises a smooth surface.

3. The vacuum chuck of claim 1 wherein the material further comprises a sintered metal.

4. The vacuum chuck of claim 1 wherein the vacuum region recess comprises at least one vacuum groove.

5. The vacuum chuck of claim 4 wherein at least two vacuum grooves are concentrically configured on the wafer holding region.

6. The vacuum chuck of claim 4 wherein the at least one vacuum groove comprises a tapered configuration.

7. A vacuum chuck for holding a semiconductor wafer during high pressure processing comprising:
   a. means for holding the semiconductor wafer, wherein a surface of the semiconductor wafer is in intimate contact with the means for holding;
   b. means for applying a vacuum to the surface of the semiconductor wafer; and
   c. means for supporting the surface of the semiconductor wafer, wherein the means for supporting is positioned within the means for applying, the means for supporting configured to allow vacuum to pass therethrough.

8. A vacuum chuck for holding a semiconductor wafer during high pressure processing comprising:
   a. a holding region for holding the semiconductor wafer, wherein a surface of the semiconductor wafer is in intimate contact with the holding region;
   b. a vacuum region recess for applying a vacuum to the surface of the semiconductor wafer; and
   c. a sintered material for supporting the surface of the semiconductor wafer, wherein the sintered material is positioned within the vacuum region recess and configured to allow vacuum to pass therethrough.

9. The vacuum chuck according to claim 8 wherein the holding region further comprises a substantially smooth surface.

10. The vacuum chuck according to claim 9 further comprising a coating material applied between the holding region and the surface of the semiconductor wafer, wherein the coating material conforms to the surface of the semiconductor wafer.

11. The vacuum chuck according to claim 8 wherein the vacuum region recess further comprises at least one vacuum groove.

12. The vacuum chuck according to claim 11 wherein the vacuum region recess further comprises at least two vacuum grooves, wherein the at least two vacuum groove are configured concentrically along the holding region.

13. The vacuum chuck according to claim 11 wherein the vacuum groove further comprises a tapered configuration.

14. The vacuum chuck according to claim 8 wherein the sintered material is configured within the vacuum region recess to provide a substantially uniform surface with the holding region.

15. A method of holding of a semiconductor wafer to a vacuum chuck during high pressure processing comprising:
    a. providing the vacuum chuck having a semiconductor holding region;
    b. applying a sintered material within a vacuum region recess and between a surface of the semiconductor wafer and the vacuum region recess;
    c. placing the semiconductor wafer to the semiconductor holding region such that the surface of the semiconductor wafer is mated with the semiconductor holding region; and
    d. applying a vacuum to the mating surface through the vacuum region recess, wherein the sintered material secures the semiconductor wafer to the semiconductor holding region by utilizing the vacuum.

16. The method of holding according to claim 15 wherein the sintered material is applied directly within the vacuum region recess.

17. The method of holding according to claim 15 wherein the sintered material is applied directly to the surface of the semiconductor wafer.

18. A vacuum chuck for holding a semiconductor wafer during high pressure processing comprising:
    a. a substantially smooth wafer holding region for holding the semiconductor wafer;
    b. a vacuum region recess for applying vacuum to a surface of the semiconductor wafer, the vacuum region recess within the wafer holding region;
    c. a coating material applied between the surface of the semiconductor wafer and the wafer holding region, the coating material for providing a seal between the surface of the semiconductor wafer and the wafer holding region; and
    d. a sintered material applied within the vacuum region recess, the sintered material for providing a substantially uniform surface between the surface and the wafer holding region.

19. The vacuum chuck according to claim 18 wherein the vacuum region recess further comprises at least one vacuum groove having a channel of predetermined dimension.

20. The vacuum chuck according to claim 19 wherein vacuum region recess further comprises two or more vacuum grooves, each vacuum groove configured concentrically along the wafer holding region.

21. The vacuum chuck according to claim 19 wherein the at least one vacuum groove comprises a tapered configuration.

* * * * *

UNITED STATES PATENT AND TRADEMARK OFFICE
CERTIFICATE OF CORRECTION

PATENT NO. : 7,021,635 B2
APPLICATION NO. : 10/359923
DATED : April 4, 2006
INVENTOR(S) : Alexei Sheydayi It is certified that error appears in the above-identified patent and that said Letters Patent is hereby corrected as shown below:

Title page,
Item [56], References Cited, U.S. PATENT DOCUMENTS, replace "6,558,475 B1 5/2003 Simons et al." with -- 6,558,475 B1 5/2003 Jur, et al. --.

| Add -- 3,681,171 | 8/1972 | Hojo et al. |
| 5,009,738 | 4/1991 | Gruenwald et al. |
| 6,221,781 B1 | 4/2001 | Siefering et al. |
| 6,306,564 B1 | 10/2001 | Mullee |
| 6,497,239 B2 | 12/2002 | Farmer et al. |
| 2003/0005948 A1 | 1/2003 | Matsuno et al. |
| 5,306,350 | 4/1994 | Hoy et al. |
| 5,772,783 | 6/1998 | Stucker |
| 5,850,747 | 12/1998 | Roberts et al. |
| 5,858,107 | 1/1999 | Chao et al. |
| 5,943,721 | 8/1999 | Lerette et al. |
| 5,946,945 | 9/1999 | Kegler et al. |
| 5,970,554 | 10/1999 | Shore et al. |
| 6,070,440 | 6/2000 | Malchow et al. |
| 6,264,753 | 7/2001 | Chao et al. |
| 6,612,317 | 9/2003 | Costantini et al. |
| 6,736,149 B2 | 5/2004 | Biberger et al. |
| 6,764,552 B1 | 7/2004 | Joyce et al. |
| 6,805,801 B1 | 10/2004 | Humayun et al. |
| 6,851,148 B2 | 2/2005 | Preston et al. |
| 6,874,513 B2 | 4/2005 | Yamagata et al. --. |

UNITED STATES PATENT AND TRADEMARK OFFICE
CERTIFICATE OF CORRECTION

PATENT NO. : 7,021,635 B2
APPLICATION NO. : 10/359923
DATED : April 4, 2006
INVENTOR(S) : Alexei Sheydayi It is certified that error appears in the above-identified patent and that said Letters Patent is hereby corrected as shown below:

<u>Title page (cont'd),</u>
FOREIGN PATENT DOCUMENTS,
Add -- JP      40 5283511    10/1993
       JP      2001-77074    3/2001 --.

Signed and Sealed this

Eleventh Day of July, 2006

JON W. DUDAS
*Director of the United States Patent and Trademark Office*